United States Patent [19]

Ito et al.

[11] Patent Number: 4,582,661
[45] Date of Patent: Apr. 15, 1986

[54] COMPOSITION FOR USE IN ELECTROMAGNETIC WAVE SHIELDING

[75] Inventors: Hirotaka Ito, Amagasaki; Akio Kusui, Itami, both of Japan

[73] Assignee: Dainichi-Nippon Cables, Ltd., Amagasaki, Japan

[21] Appl. No.: 598,333

[22] PCT Filed: Jul. 25, 1983

[86] PCT No.: PCT/JP83/00238

§ 371 Date: Mar. 16, 1984

§ 102(e) Date: Mar. 16, 1984

[87] PCT Pub. No.: WO84/00555

PCT Pub. Date: Feb. 16, 1984

[30] Foreign Application Priority Data

Jul. 26, 1982 [JP] Japan .................. 57-130736

[51] Int. Cl.$^4$ .......... C08K 7/02; C08L 27/06; C08L 55/02; H01B 7/18

[52] U.S. Cl. .................. 264/277; 264/279; 264/328.18; 343/18 A; 428/197; 428/246; 428/252; 523/137; 524/413; 524/440; 524/781; 252/512

[58] Field of Search .............. 523/137; 524/413, 440, 524/781; 428/246, 197, 252; 343/18 A; 264/279, 277, 331.13, 331.15, 328.18

[56] References Cited

U.S. PATENT DOCUMENTS

| | | | |
|---|---|---|---|
| 2,996,709 | 8/1961 | Pratt | 523/137 |
| 3,733,606 | 5/1973 | Johansson | 343/18 A |
| 4,064,305 | 12/1977 | Wallin | 428/246 |
| 4,112,175 | 9/1978 | Kikuchi et al. | 428/236 |
| 4,201,829 | 5/1980 | Mast et al. | 525/87 |
| 4,288,081 | 9/1981 | Sado | 252/512 |
| 4,443,565 | 4/1984 | Kasahara et al. | 523/137 |
| 4,474,685 | 10/1984 | Annis | 523/137 |

FOREIGN PATENT DOCUMENTS

| | | | |
|---|---|---|---|
| 0090432 | 10/1983 | European Pat. Off. | 523/137 |
| 2026890 | 12/1971 | Fed. Rep. of Germany | 523/137 |
| 0157633 | 12/1980 | Japan | 523/137 |
| 0065751 | 4/1982 | Japan | 523/137 |
| 78499 | 5/1983 | Japan . | |
| 127743 | 7/1983 | Japan | 523/220 |
| 0136644 | 8/1983 | Japan | 523/137 |
| 2089817 | 6/1982 | United Kingdom | 523/137 |

OTHER PUBLICATIONS

Derwent Abst. 44429 E/22 J57065754 (4-1982).

*Primary Examiner*—Herbert J. Lilling
*Attorney, Agent, or Firm*—W. G. Fasse; D. H. Kane, Jr.

[57] ABSTRACT

A shielding composition has an electromagnetic wave shielding property and also an injection molding property. The composition comprises at least one kind of embedding material selected from a group consisting of plasticized vinyl chloride and acrylonitrile-butadiene-styrene resin, and copper or copper alloy fiber having a diameter of 1–100 μm and a length of 0.5–10 mm embedded in said embedding material. The amount of the fibers is 30–70% by weight of the total composition.

7 Claims, No Drawings

COMPOSITION FOR USE IN ELECTROMAGNETIC WAVE SHIELDING

FIELD OF THE ART

This invention relates to a composition for use in electromagnetic wave shielding suitable for electronic apparatuses, and electronic parts, etc. and having an excellent in injection moldability.

BACKGROUND OF THE ART

In order to industrially manufacture at low cost an interface bus cable for connecting electronic components such as peripheral units for personal computers while avoiding an electric wave leaking, it is necessary to insulate the connection between cores and terminals of the bus cable and to cover the thus insulated connection with an electromagnetic shielding material by injection molding. However, shielding material heretofore proposed does not have a sufficient fluidity above the melting point or softening point of a base polymer. Hence, there was a problem in that it was difficult to properly place the shielding material by injection molding techniques so that the shielding material would assume the shape defined by a metal mold or in that the molded material would not have a smooth surface. It was impossible to obtain properly shaped shielding members having a smooth surface.

DISCLOSURE OF THE INVENTION

In view of the problems described above, this invention proposes a novel composition for use as electromagnetic wave shielding having both an excellent electromagnetic wave shielding ability and an injection moldability. The composition proposed according to the invention comprises at least one kind of a suspension or embedding agent selected from a group consisting of plasticized vinyl chloride resin, and acrylonitrile-butadiene-styrene resins and fibers suspended or embedded in said agent, said fibers consisting of copper or of a copper alloy and having a diameter of 1–100 $\mu$m and a length of 0.5–10 mm. The fiber content contained in the composition amounts to 30–70% by weight of the composition.

The plasticized vinyl chloride resin used by the invention may be, for example a vinyl chloride homopolymer, a vinyl chloride copolymer, or an internally plasticized vinyl chloride copolymer, etc, plasticized by the use of a plasticizer or an organic high polymer compatible with vinyl chloride resin. A composition is particularly useful for the present purposes if it has a vicosity, at a temperature of 180° C., measured by a Brabender plastograph, in the range of 50–3,000 m-g, more particularly 100–2,000 m-g. The unit: m-g is used in the present disclosure for all viscosity values as measured by said plastograph at said temperature condition. more particularly 100–2,000 m-g is suitably used. Such a composition shows an excellent injection moldability in a state in which metal fibers to be described below, are compounded in large quantities.

The above-mentioned vinyl chloride homopolymer may be produced by a conventional known polymerization process such as an ordinary suspension polymerization, an emulsion polymerization, a bulk polymerization or a solution polymerization. A homopolymer is particularly suitable for the present purpose if its mean degree of polymerization ($\bar{P}$) is within the range of 300–2,000, especially 400–1,100, because it has desirable injection molding features.

The above-mentioned vinyl chloride copolymer may be produced by an above mentioned conventional process, and has the characteristic in that (a) the vinyl chloride content is at least 50% by weight and particularly at least 80% by weight, (b) the viscosity is lower than that of vinyl chloride homopolymer, and (c) the mean degree of polymerization is within the range of 300–2,000 and especially 400–1,100. Such vinyl chloride copolymer includes (1) copolymers of vinyl chloride with at least one kind of monomer capable of effecting radical polymerization with vinyl chloride, for example, olefin, diene, unsaturated carboxylic acid and its esteric derivatives, unsaturated nitryl, aromatic vinyl and it derivatives; (2) graft polymers obtained by grafting upon vinyl chloride homopolymer or the above vinyl chloride copolymer at least one kind of monomer capable of effecting radical polymerization with the above vinyl chloride; (3) copolymers of vinyl chloride and polymer copolymerizable with vinyl chloride, for example, olefin-vinyl ester copolymer such as ethylene-vinyl acetate copolymer, olefin-alkylacrylate copolymer such as ethylene-methylacrylate, olefin-alkyl methacrylate copolymer such as ehtylene methyl methacrylate, polyolefin type polymer such as polyethylene, ethylene-propylene copolymer, ethylene-propylene copolymer, chlorinated polyethylene and chloro-sulfonated polyethylene, polyether type polymer such as ethylene epichlorohydrine copolymer, diene type elastomer such as polybutadiene and polyisoprene, acrylonitrile-butadiene-styrene copolymer, methyl methacrylate-butadiene-styrene copolymer, etc.; (4) copolymers of vinyl chloride and at least one kind of the above polymers copolymerizable with vinyl chloride and at least one kind of above monomers capable of effecting radical polymerization with vinyl chloride.

Particularly, a copolymer of vinyl chloride and a monomer capable of effecting radical polymerization with vinyl chloride, is desirable, and in addition, the copolymer which is 80–99.5% by weight of the vinyl chloride content, is particularly desirable.

As a plasticizer there may be used a conventional plasticizer for vinyl chloride resin, for example, (1) esters phthalate such as di 2-ethylhexyl phthalate, di n-octyl phthalate, diisodecyl phthalate, diisonyl phthalate and mixed basic ester phthalate having 7–11 carbons; (2) esters phosphate such as tricresyl phosphate, triphenyl phosphate, trioctyl phosphate, cresyldiphenyl phosphate; (3) aromatic carboxylic acid esters, such as ester trimelliticate such as octyl trimelliticate, ester trimesicate, ester pyromelliate; (4) aliphatic dibasic esters such as diethyl adipicate, diisodecyl adipicate, dioctyl sebacicate; (5) polyesters of adpinic acid or sebacic acid; and (6) chlorinated paraffins.

The amount of the plasticizer described above for plasticizing vinyl chloride resin to have the viscosity mentioned above can easily be determined by an experiment, but generally, the amount of use of this plasticizer is 10–80 parts per 1,000 parts by weight of vinyl chloride resin.

As an organic high polymer compatible with vinyl chloride resin and being able to plasticize the vinyl chrolide resin, there may be used, for example, acrylonitrile-butadiene rubber, thermoplastic urethane, thermoplastic polyester, ethylene-vinyl acetate copolymer containing a high proportion of vinyl acetate, say, more than 35% by weight, and the like. The mentioned organic high polymers may be mixed with vinyl chloride resin alone or in combination with one of the plasticizers mentioned above.

Of the vinyl chloride copolymers mentioned above, those which are within the above range may be used alone as internally plasticized vinyl chloride resins.

The various plasticized polyvinyl chloride resins of the type described above which are used by the invention may be used alone or in mixture of more than two kinds. In addition, one or more than two kinds of ordinary chemical agents may be compounded such as a stabilizer, lubricant, pigment, flame retarder, if necessary, which are usually compounded with vinyl chloride resin. However, it is to be noted that the amount of the chemical agent should be such that the viscosity of vinyl chloride resin obtained by the compounding should be limited within the range described above.

A stabilizer which is usually used for molding vinyl chloride resins, may also be used for the present purposes, for example (1) a lead type stabilizers such as dibasic lead sulfate, dibasic lead phosphonate, dibasic lead stearate; (2) tin type stabilizers such as dibutyl tin laurate, dibutyl tin maleate, dibutyl tin fumarate; (3) complex stabilizers such as Ba.Zn complex stabilizer, Ba.Ca complex stabilizer, and so on, may be used.

A conventional flame retarder used in vinyl chloride resin, for example, antimony trioxide, alumina hydrate, etc, may be used for the present purpose.

In the invention, an acrylonitrile-butadiene-styrene copolymer may be used in the form of a base polymer manufactured by a polymer blending process such as a kneading-mixing process, a latex mixing process or a graft polymerization process such as emulsion polymerization, bulk polymerization, suspension polymerization, or the like process. If necessary, ordinary chemical agents such as a pigment and an oxidation retarder in usual amounts may be compounded into the acrylonitrile-butadiene-styrene copolymer.

The copper or copper alloy used in the invention is pure copper or a copper alloy such as an alloy of copper with at least one kind of elements such as zinc, tin, lead, phosphor, iron, manganese, aluminum, nickel, silicium, beryllium, silver, tellurium, cadmium, chromium, selenium, zirconium. The alloy has a copper content of at least 50% by weight, for example, and employing electrolytic copper, deoxidized copper, oxygen free copper, free cutting copper, red copper, brass, bronze, Corson alloy, Heussler alloy, German silver, cupro-nickel, beryllium copper, silver copper, chromium copper, and the like.

Fibers made of the above-mentioned copper or copper alloy having a diameter of 1–100 $\mu$m and a length of 0.5–10 mm, are superior in softness or pliability to other metal fibers and are also superior in their kneading and mixing properties with respect to vinyl chloride resin and acrylonitrile-butadiene-styrene resin, so that the copper or the copper alloys mentioned above are both essential and excellent for the production of a composition of the invention which has excellent injection moldability qualities and electroconductivity qualities.

Fibers of copper alloys consisting essentially of copper and zinc in the following weight ratio range of copper to zinc, namely 95:5–60:40, particularly 80:20–63:35, are especially desirable because of their softness or pliability and because of their injection moldablity.

The composition of the invention comprises plasticized vinyl chloride resin (for example, consisting of vinyl chloride resin and a plasticizer) and/or acrylonitrile-butadiene-styrene copolymer, copper or copper alloy fiber, and other chemicals compounded, if necessary, and the quantity of the copper or copper alloy fiber contained in the composition of the invention is 30–70% by weight.

When the copper or copper alloy fibers are shorter in length than 0.5 mm or smaller in the amount of use than 30% by weight, the conduction effect is reduced and, on the other hand, when the fibers used are larger in length than 10 mm or larger in diameter than 100 $\mu$m, an injection molder is clogged up, or when it is larger in the amount of use than 70% by weight, the viscosity of the composition increases extremely, enough so as to decrease the injection moldability in any event. Also, when the fibers used are finer in diameter than 1 82 m, the fibers are cut and reduced in length at the time of mixing with the plasticized vinyl chloride resin, with the result that the composition has a reduced conductivity.

When the composition of the invention has a volume resistivity within the range of 0.005–0.5 $\Omega$cm, particularly 0.005–0.1 $\Omega$cm, it has a good surface conductivity and especially it produces an electromagnetic wave shielding effect. On the other hand, when the viscosity of the composition of the invention is 100–5,000 m-g, particularly 200–2,000 m-g, it has an especially excellent injection moldability. It is possible to produce the composition of the invention having the above properties by controlling the size of the fibers used and the quantities. Desirable copper or copper alloy fibers have a diameter of 20–80 $\mu$m and particularly 40–60 $\mu$m, and a length of 1–6 mm, particularly 2–4 mm. Also, the quantity of fibers is preferably 35–65% by weight and particularly 40–60% by weight.

The composition of the invention may be produced with the aid of a general mixer such as a two-roller mixer, a Banbury mixer (trade name) in such various ways of addition that a plasticizer, copper or copper alloy fiber and other chemicals are together added to the vinyl chloride resin or that vinyl chloride resin is beforehand plasticized by a plasticizer and then the remaining chemical components are added to the plasticized vinyl chloride resin.

The composition of the invention has excellent electromagnetic wave shielding and injection molding properties. Hence, the present composition is suitable for use in covering, by injection molding, the leaking wave generating portion of various electronic devices and electronic components which cause radio wave interference. Particularly, when the composition of the invention is used as a shielding material of a connector for a bus cable forming an interface for personal computer components, which in recent years have been used in steadily increasing numbers in homes, the present composition provides a great improvement in the prevention of wave interferences caused by electromagnetic wave leaks as compared to conventional connectors used for example, in radio receivers and television sets.

PREFERRED EMBODIMENTS OF THE INVENTION

A detailed description will now be given of examples according to the invention and of contrast examples the latter being comparable examples. Symbols for the compositions used in the invention examples and contrast examples, and contents of the compositions are shown in Table 1 in which the part and percentages used are represented by parts by weight and percent by weight figures, respectively.

Table 2 shows compositions and properties of the invention examples (Example Nos. 1-23) and contrast examples (Contrast Example Nos. 1-10). Furthermore, the compounding ratio shown in the base polymer composition in the Table represents parts by weight, and the percentage of metal fiber represents percent by weight figures of the fiber contained in the composition of the invention and contrast examples. All the constituents, except the metal fiber, of the composition in each example are sufficiently mixed by two rollers which were beforehand heated to a temperature of 180° C., and then the metal fiber was added to the thus sufficiently mixed composition on the two rollers and the mixing was then continued to obtain an intended composition.

The characteristics of the invention and of the reference examples were determined and rated by the following processes.

INJECTION MOLDABILITY

For rating the injection moldability of the present invention a bus cable for an interface in personal computers was prepared. The bus cable was constructed by placing a layer of shielding braid on a bundle of 24 cores, a connector having 25 contacts was mounted to each end of the multicore cable having an outer diameter of 1.5 mm, a protective sheath consisting of vinyl chloride homopolymer containing a plasticizer was applied to the cable, the conductor of each core was directly connected to its respective contact, and the copper shielding braid was connected through a drainage wire to one remaining contact.

The surface of the above connection portions was insulated. In this state, the cable of the invention and of the contrast examples were injection-molded on the surface of the connector at both ends of the bus cable placed in the mold having a controlled temperature of 50° C.-70° C. and on the surface of a part of the cable away from the connector, by the use of a 2.5 oz. injection molder having a nozzle diameter of 2.5 mm, a barrel temperature of 180° C., and operating with an extrusion pressure of 50 kg/cm$^2$. The results of the examples are shown in five steps as follows.

Grade A (excellent) . . . . There is no dimensionally broken portion and gloss and smoothness on the surface are also good.

Grade B (good) . . . . There is no dimensionally broken portion and the surface is smooth but slightly lacking in gloss.

Grade C (rather good) . . . . There is no dimensionally broken portion but there are partially coarse portions on the surface.

Grade D (passable) . . . . There is no dimensionally broken portion in the portion near the terminal end portions of resin flow path inside the metal mold and in the bellows portion at the joint of the cable. In addition, most of the surface is rough.

Grade E (no good) . . . . The nozzle is stopped up, or a too high viscosity makes the injection molding impossible.

VOLUME RESISTIVITY

The composition was subjected to pressure forming under the conditions of a temperature of 180° C., a pressure of 100 kg/cm$^2$ and a duration of 5 min. as determined by a process specified in ASTM D-991-68 per sheet of 1 mm in diameter and 10 cm both in length and in width.

ELECTROMAGNETIC WAVE SHIELDING PROPERTY

The shielding effect was determined for each bus cable obtained by rating the injection moldability by the absorption clamp process in accordance with IEC CISPR Pub. 16. Incidentally, a bus cable before a shielding material was injection-molded over the cable was used as a control (see Table 2) or reference cable.

TABLE 1

| Abbreviations | Contents |
|---|---|
| Organic High Polymer Constituting a Base of Composition | |
| PVC1 | Vinyl chloride homopolymer ($\overline{P}$: 1500) |
| PVC2 | Vinyl chloride homopolymer ($\overline{P}$: 800) |
| PVC3 | Vinyl chloride homopolymer ($\overline{P}$: 600) |
| VCVA1 | Vinyl chloride-vinyl acetate copolymer ($\overline{P}$: 1100, VC: 98%) |
| VCVA2 | Vinyl chloride-vinyl acetate copolymer ($\overline{P}$: 800, VC: 98%) |
| VCE1 | Vinyl chloride-ethylene copolymer ($\overline{P}$: 1100, VC: 98%) |
| VCE2 | Vinyl chloride-ethylene copolymer ($\overline{P}$: 600, VC: 97%) |
| VCE3 | Vinyl chloride-ethylene copolymer ($\overline{P}$: 1100, VC: 93%) |
| VCU | Vinyl chloride-urethane copolymer ($\overline{P}$: 1100, VD: 50%) |
| EVAVC | Ethylene-vinyl acetate-vinyl chloride graft copolymer ($\overline{P}$: 1100, VC: 50%, VA: 25%, E: 25%) |
| ABS | Acrylonitrile-butadiene-styrene copolymer |
| PE | Polyethylene (d: 0.925, MI: 1) |
| Plasticizer or High Organic Polymer for Use in Plasticization | |
| DOP | Di n-octyl phthalate |
| DIDP | Diisodecyl phthalate |
| TOTM | Trioctyl trimelliticate |
| DINP | Diisononyl phthalate |
| TCP | Tricresyl phosphate |
| TOP | Trioctyl phosphate |
| TPP | Triphenyl phosphate |
| NBR | Acrylonitrile-butadiene rubber |
| Metal Fiber | |
| Brass 1 | 7/3 brass (diameter: 30 μm, length: 6 mm) |
| Brass 2 | 7/3 brass (diameter: 50 μm, length: 4 mm) |
| Brass 3 | 7/3 brass (diameter: 60 μm, length: 2 mm) |
| Brass 4 | 6/4 brass (diameter: 50 μm, length: 4 mm) |
| Brass 5 | 6/4 brass (diameter: 60 μm, length: 2 mm) |

TABLE 1-continued

| Abbreviations | Contents |
|---|---|
| Brass 6 | Naval brass (diameter: 50 μm, length: 3 mm) |
| Brass 7 | 7/3 brass (diameter: 0.5 μm, length: 5 mm) |
| Brass 8 | 7/3 brass (diameter: 200 μm, length 3 mm) |
| Brass 9 | 7/3 brass (diameter: 10 μm, length: 0.1 mm) |
| Brass 10 | 7/3 brass (diameter: 50 μm, length: 30 mm) |
| Red copper 1 | 9/1 red copper (diameter: 50 μm, length: 3 mm) |
| Red copper 2 | 9/1 red copper (diameter: 60 μm, length: 1 mm) |
| Pure copper 1 | Electrolytic copper (diameter: 20 μm, length: 6 mm) |
| Pure copper 2 | Electrolytic copper (diameter: 60 μm, length: 2 mm) |
| Al | Pure aluminum (diameter: 50 μm, length: 3 mm) |
| Ni | Pure nickel (diameter: 50 μm, length: 3 mm) |
| Other Chemicals | |
| $Sb_2O_3$ | Antimony trioxide |
| AO | Alumina hydrate, $Al_2O_3.3H_2O$ |
| TS | Tribasic lead sulfate |
| LFOS | Dibasic lead phosphonate |
| ABT | Ba—Zn dibutyl tin laurate |
| Ba.Zn | Ba—Zn compound stabilizer (produced by Nippon Ink K.K. under the trade name "INSTAS TARB M 7268 T") |
| SA | Stearic acid |

Note:
The symbol P represents mean degree of polymerization; VC content of vinyl chloride constituent; VA content of vinyl acetate constituent; E content of ethylene constituent; d density; and MI represents a melt index.

TABLE 2

| | Control | Contrast Example 1 | Contrast Example 2 | Contrast Example 3 | Contrast Example 4 | Contrast Example 5 | Contrast Example 6 | Contrast Example 7 | Contrast Example 8 | Contrast Example 9 | Contrast Example 10 | Example 1 |
|---|---|---|---|---|---|---|---|---|---|---|---|---|
| Composition | | | | | | | | | | | | |
| Base Composition (part by wt.) | PE 100 | PVC1 100 DOP 50 TS 5 SA 1 | same as left | VCVA 100 DIDP 50 DBL 5 SA 1 | Brass 1 100 DOP 50 TS 5 SA 1 | same as left | same as left | VCVA1 100 DZDP 50 DBL 5 TS 3 | same as left | same as left | same as left | VCVA1 100 DOP 50 TS 5 SA 3 |
| Metal Fiber Composition (% by weight) | — | Brass 1 50 | Al 50 | Ni 50 | Brass 1 20 | Brass 1 80 | Al 80 | brass 7 50 | brass 8 50 | brass 9 50 | brass 10 50 | brass 1 40 |
| Characteristics | | | | | | | | | | | | |
| Injection Moldability | — | good | not good | good | excellent | good | not good | excellent | not good | excellent | not good | excellent |
| Volume Resistivity Ω cm | — | $6 \times 10^{-1}$ | $4 \times 10^{-1}$ | $3.5 \times 10^{-1}$ | $2 \times 10^2$ | $8 \times 10^{-2}$ | $9 \times 10^{-2}$ | $1 \times 10^1$ | $3 \times 10^{-2}$ | $1.5 \times 10^1$ | $4 \times 10^{-2}$ | $9 \times 10^{-2}$ |
| Electromagnetic Wave Shielding Effect (dB) | | | | | | | | | | | | |
| 30 MHz | 10 | 50 | — | 56 | 23 | 70 | — | 12 | — | 13 | — | 70 |
| 100 MHz | 10 | 50 | — | 56 | 18 | >70 | — | 14 | — | 12 | — | >70 |
| 300 MHz | 10 | 50 | — | 60 | 13 | >70 | — | 13 | — | 15 | — | >70 |
| 500 MHz | 15 | 55 | — | 60 | 17 | >70 | — | 18 | — | 16 | — | >70 |
| 1000 MHz | 20 | 60 | — | 70 | 20 | >70 | — | 15 | — | 16 | — | >70 |
| Viscosity (m − g) | — | 5400 | 6200 | 5350 | 1300 | 5450 | 7100 | 1400 | 1700 | 1450 | 1750 | 1400 |

| | Example 2 | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|---|
| Composition | | | | | | | | | | | | |
| Base Composition (part by wt.) | VCV1 100 DOP 50 TS 5 SA 3 | VCE3 100 TOP 40 TS 7 | VCU 100 TPP 40 TS 7 | same as left | same as left | same as left | same as left | VCVA1 100 DOP 20 50 TS 5 SA 3 | PVC2 100 TOTM 40 DBT 8 | PVC3 100 TOTM 40 DBT 7 | VCE2 100 TCP 45 TS 7 | VCE1 100 DINP 45 TS 7 LFOS |
| Metal Fiber Composition (% by weight) | brass 1 50 | brass 1 60 | brass 2 48 | brass 3 48 | brass 4 48 | brass 5 48 | brass 6 48 | red copper 1 50 | pure copper 1 50 | pure copper 2 50 | — | brass 3 50 |
| Characteristics | | | | | | | | | | | | |
| Injection Moldability | excellent | excellent | excellent | excellent | excellent | excellent | excellent | excellent | good | good | excellent | excellent |
| Volume Resistivity Ω cm | $6 \times 10^{-2}$ | $1 \times 10^{-2}$ | $2.5 \times 10^{-2}$ | $5.5 \times 10^{-2}$ | $3 \times 10^{-2}$ | $4.4 \times 10^{-2}$ | $3.8 \times 10^{-2}$ | $8 \times 10^{-2}$ | $4.3 \times 10^{-2}$ | $3 \times 10^{-2}$ | $2 \times 10^{-2}$ | $4 \times 10^{-2}$ |
| Electromagnetic Wave Shielding Effect (dB) | | | | | | | | | | | | |
| 30 MHz | >70 | >70 | >70 | >70 | >70 | >70 | >70 | >70 | >70 | >70 | >70 | >70 |
| 100 MHz | >70 | >70 | >70 | >70 | >70 | >70 | >70 | >70 | >70 | >70 | >70 | >70 |
| 300 MHz | >70 | >70 | >70 | >70 | >70 | >70 | >70 | >70 | >70 | >70 | >70 | >70 |
| 500 MHz | >70 | >70 | >70 | >70 | >70 | >70 | >70 | >70 | >70 | >70 | >70 | >70 |
| 1000 MHz | >70 | >70 | >70 | >70 | >70 | >70 | >70 | >70 | >70 | >70 | >70 | >70 |
| Viscosity (m − g) | 1500 | 1650 | 1480 | 1440 | 1500 | 1550 | 1480 | 1250 | 850 | 650 | 1700 | 1450 |

| | Example 14 | Example 15 | Example 16 | Example 17 | Example 18 | Example 19 | Example 20 | Example 21 | Example 22 | Example 23 |
|---|---|---|---|---|---|---|---|---|---|---|
| Composition | | | | | | | | | | |
| Base Composition (part by wt.) | VCE2 100 TCP 40 Ba,Zn 5 | VCE3 100 TOP 40 TS 7 | VCV1 100 TPP 40 TS 7 | EVAVC 100 DOP 10 TS 8 | ABS 100 | VCVA1 100 DOP 50 TS 5 SA 3 | same as left | VCVA2 100 TCP 40 TS 10 | VCVA1 100 DINP 40 TS 10 | VCE2 100 TCP 50 LFOS 10 |

TABLE 2-continued

| Metal Fiber (% by weight) | brass 3 50 | brass 3 50 | brass 2 50 | brass 4 50 | brass 1 55 | brass 2 45 | Sb$_2$O$_3$ 10 / pure copper 1 45 | Sb$_2$O$_3$ 10 / brass 3 45 | AO 10 / brass 3 45 | same as left |
|---|---|---|---|---|---|---|---|---|---|---|
| Characteristic | | | | | | | | | | |
| Injection Moldability | good | good | excellent | excellent | excellent | excellent | excellent | good | good | good |
| Volume Resistivity Ω cm | $3 \times 10^{-2}$ | $2.5 \times 10^{-2}$ | $1 \times 10^{-2}$ | $1 \times 10^{-1}$ | $1.2 \times 10^{-2}$ | $6 \times 10^{-2}$ | $3 \times 10^{-2}$ | $3.8 \times 10^{-2}$ | $5.2 \times 10^{-2}$ | $5.3 \times 10^{-2}$ |
| Electromagnetic Wave Shielding Effect (dB) | | | | | | | | | | |
| 30 MHz | >70 | >70 | >70 | >70 | >70 | >70 | >70 | >70 | >70 | >70 |
| 100 MHz | >70 | >70 | >70 | >70 | >70 | >70 | >70 | >70 | >70 | >70 |
| 300 MHz | >70 | >70 | >70 | >70 | >70 | >70 | >70 | >70 | >70 | >70 |
| 500 MHz | >70 | >70 | >70 | >70 | >70 | >70 | >70 | >70 | >70 | >70 |
| 1000 MHz | >70 | >70 | >70 | >70 | >70 | >70 | >70 | >70 | >70 | >70 |
| Viscosity (m · g) | 800 | 600 | 900 | 1700 | 800 | 750 | 740 | 660 | 720 | 820 |

What is claimed is:

1. An electromagnetic wave shielding composition suitable for press forming or injection molding purposes, comprising an embedding material selected from a group consisting of plasticized vinyl chloride resin and acrylonitrile-butadiene-styrene resin, and copper or copper alloy fibers embedded in said embedding material, said fibers having a diameter of 1-100 μm and a length of 0.5-10 mm, wherein the amount of the fibers is 30-70% by weight of said composition, said composition having a shielding effect of at least 70 (dB) in a frequency range of about 30 MHz to about 1000 MHz and a volume resistivity in the range of about 0.005 to about 0.5 Ωcm.

2. The composition according to claim 1, having a viscosity in the range of 200-2,000 m-g at a temperature of 180° C.

3. The composition according to claim 1, wherein said plasticized vinyl chloride comprises of vinyl chloride copolymer and a plasticizer, said vinyl chloride copolymer being at least 50% by weight in vinyl chloride content and wherein said vinyl chloride copolyer has a mean degree of polymerization within the range of 400 to 1,200.

4. The composition according to claim 3, wherein said vinyl chloride copolymer is a copolymer of vinyl chloride and at least one kind of monomers, said monomers being capable of effecting radical polymerization with vinyl chloride, wherein said vinyl chloride is 80-99.5% by weight in content.

5. The composition according to claim 1, wherein said copper or copper in said copper alloy is pure copper.

6. The composition according to claim 1, wherein said copper alloy consists essentially of copper and zinc, and wherein the copper ranges from 60:95% by weight of the copper alloy and the zinc ranges from 40:5% by weight of the copper alloy.

7. A method of shielding an electromagnetically radiating device against radiation leaks, comprising the following steps:
(a) preparing, by mixing, an electromagnetic wave shielding composition comprising an embedding material selected from a group consisting of plasticized vinyl chloride resin and acrylontrile-butadiene-styrene resin, and copper or copper alloy fibers embedded in said embedding material, said fibers having a diameter of 1-100 μm and a length of 0.5-10 mm, wherein the amount of the fiber is 30-70% by weight of said composition, and
(b) injection molding the so prepared composition onto said radiating device for preventing said radiation leaks, said composition having a shielding effect of at least 70 (dB) in a frequency range of about 30 MHz to about 1000 MHz and a volume resistivity in the range of about 0.005 to about 0.5 Ωcm.

* * * * *